(12) United States Patent
Rathburn

(10) Patent No.: US 9,184,145 B2
(45) Date of Patent: Nov. 10, 2015

(54) SEMICONDUCTOR DEVICE PACKAGE ADAPTER

(75) Inventor: James Rathburn, Maple Grove, MN (US)

(73) Assignee: HSIO TECHNOLOGIES, LLC, Maple Grove, MN (US)

( * ) Notice: Subject to any disclaimer, the term of this patent is extended or adjusted under 35 U.S.C. 154(b) by 344 days.

(21) Appl. No.: 13/643,436

(22) PCT Filed: Apr. 25, 2011

(86) PCT No.: PCT/US2011/033726
§ 371 (c)(1),
(2), (4) Date: Dec. 6, 2012

(87) PCT Pub. No.: WO2011/139619
PCT Pub. Date: Nov. 10, 2011

(65) Prior Publication Data
US 2013/0105984 A1 May 2, 2013

Related U.S. Application Data

(63) Continuation-in-part of application No. 13/266,573, filed as application No. PCT/US2010/036363 on May (Continued)

(51) Int. Cl.
*H01L 23/00* (2006.01)
*H01L 23/48* (2006.01)
(Continued)

(52) U.S. Cl.
CPC .............. *H01L 24/14* (2013.01); *H01L 23/552* (2013.01); *H01L 24/19* (2013.01); *H01L 24/20* (2013.01);

(Continued)

(58) Field of Classification Search
USPC ......... 257/773, 737, 734, 738, 778, 780, 782, 257/779; 439/55, 65, 66; 29/592, 874; 438/107
See application file for complete search history.

(56) References Cited

U.S. PATENT DOCUMENTS

| 3,672,986 A | 6/1972 | Schneble, Jr. et al. |
| 4,188,438 A | 2/1980 | Burns |

(Continued)

FOREIGN PATENT DOCUMENTS

| JP | 2003/217774 | 7/2003 |
| WO | WO 91/14015 | 9/1991 |

(Continued)

OTHER PUBLICATIONS

Restriction Requirement mailed Mar. 1, 2013 in co-pending U.S. Appl. No. 13/318,200, now published as US Patent Application Publication No. US 2012/0056332.

(Continued)

*Primary Examiner* — Alexander Oscar Williams
(74) *Attorney, Agent, or Firm* — Stoel Rives LLP

(57) ABSTRACT

A semiconductor device packaged adapter for electrically coupling contacts on a first circuit member to contacts on a second circuit member. The adapter typically includes first and second substrates, each with arrays of terminals. Proximal ends of the first terminals on the first substrate are arranged to be soldered to the contacts on the first circuit member and proximal ends of the second terminals on the second substrate are arranged to be soldered to the contacts on the second circuit member. Complementary engaging structures located on distal ends of the first and second terminals engage to electrically and mechanically couple the first circuit member to the second circuit member.

22 Claims, 19 Drawing Sheets

Related U.S. Application Data 27, 2010, application No. 13/643,436, which is a continuation-in-part of application No. 13/318,200, filed as application No. PCT/US2010/036288 on May 27, 2010, application No. 13/643,436, which is a continuation-in-part of application No. 13/320,285, filed as application No. PCT/US2010/036282 on May 27, 2010.

(60) Provisional application No. 61/327,795, filed on Apr. 26, 2010, provisional application No. 61/183,411, filed on Jun. 2, 2009, provisional application No. 61/183,356, filed on Jun. 2, 2009, provisional application No. 61/183,340, filed on Jun. 2, 2009.

(51) Int. Cl.
*H01R 12/70* (2011.01)
*H01R 13/6474* (2011.01)
*H01L 23/552* (2006.01)
*H05K 3/32* (2006.01)
*H01R 13/6585* (2011.01)
*H01L 25/065* (2006.01)
*H05K 3/34* (2006.01)

(52) U.S. Cl.
CPC ............ *H01L 24/81* (2013.01); *H01R 12/7076* (2013.01); *H01R 13/6474* (2013.01); *H05K 3/32* (2013.01); *H01L 25/0655* (2013.01); *H01L 25/0657* (2013.01); *H01L 2224/04105* (2013.01); *H01L 2924/01029* (2013.01); *H01L 2924/10253* (2013.01); *H01L 2924/1306* (2013.01); *H01R 13/6585* (2013.01); *H01R 2201/20* (2013.01); *H05K 3/3436* (2013.01); *H05K 2201/1059* (2013.01); *H05K 2201/10378* (2013.01); *H05K 2201/10734* (2013.01); *H05K 2201/10962* (2013.01)

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A | 10/1990 | Reed | |
| 5,014,159 A | 5/1991 | Butt | |
| 5,071,363 A | 12/1991 | Reylek et al. | |
| 5,072,520 A | 12/1991 | Nelson | |
| 5,127,837 A | 7/1992 | Shah et al. | |
| 5,129,573 A | 7/1992 | Duffey | |
| 5,161,983 A | 11/1992 | Ohno et al. | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,674,595 A | 10/1997 | Busacco et al. | |
| 5,691,041 A | 11/1997 | Frankeny et al. | |
| 5,716,663 A | 2/1998 | Capote et al. | |
| 5,741,624 A | 4/1998 | Jeng et al. | |
| 5,746,608 A | 5/1998 | Taylor | |
| 5,761,801 A | 6/1998 | Gebhardt et al. | |
| 5,764,485 A | 6/1998 | Lebaschi | |
| 5,785,538 A | 7/1998 | Beaman et al. | |
| 5,787,976 A * | 8/1998 | Hamburgen et al. | 165/185 |
| 5,802,699 A | 9/1998 | Fjelstad et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,921,786 A | 7/1999 | Slocum et al. | |
| 5,925,931 A | 7/1999 | Yamamoto | |
| 5,933,558 A | 8/1999 | Sauvageau et al. | |
| 5,973,394 A | 10/1999 | Slocum et al. | |
| 6,020,597 A | 2/2000 | Kwak | |
| 6,062,879 A | 5/2000 | Beaman et al. | |
| 6,080,932 A | 6/2000 | Smith et al. | |
| 6,107,109 A * | 8/2000 | Akram et al. | 438/15 |
| 6,114,240 A * | 9/2000 | Akram et al. | 438/667 |
| 6,118,426 A | 9/2000 | Albert | |
| 6,120,588 A | 9/2000 | Jacobson | |
| 6,137,687 A | 10/2000 | Shirai et al. | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,225,692 B1 | 5/2001 | Hinds | |
| 6,247,938 B1 | 6/2001 | Rathburn | |
| 6,252,564 B1 | 6/2001 | Albert | |
| 6,255,126 B1 | 7/2001 | Mathieu et al. | |
| 6,263,566 B1 | 7/2001 | Hembree et al. | |
| 6,270,363 B1 | 8/2001 | Brofman et al. | |
| 6,288,451 B1 | 9/2001 | Tsao | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,428,328 B2 | 8/2002 | Haba et al. | |
| 6,437,452 B2 | 8/2002 | Lin | |
| 6,437,591 B1 | 8/2002 | Farnworth et al. | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,462,568 B1 | 10/2002 | Cram | |
| 6,477,286 B1 | 11/2002 | Ouchi | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,572,396 B1 | 6/2003 | Rathburn | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,662,442 B1 | 12/2003 | Matsui et al. | |
| 6,709,967 B2 | 3/2004 | Evers | |
| 6,744,126 B1 | 6/2004 | Chiang | |
| 6,750,473 B2 | 6/2004 | Amundson | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,856,151 B1 | 2/2005 | Cram | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,962,829 B2 | 11/2005 | Glenn et al. | |
| 6,965,168 B2 | 11/2005 | Langhorn | |

(56) References Cited

U.S. PATENT DOCUMENTS

| | | |
|---|---|---|
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 * | 6/2007 | Sashinaka et al. ............ 385/88 |
| 7,244,967 B2 | 7/2007 | Hundt et al. |
| 7,249,954 B2 | 7/2007 | Weiss |
| 7,276,919 B1 * | 10/2007 | Beaman et al. .......... 324/755.01 |
| 7,301,105 B2 | 11/2007 | Vasoya |
| 7,321,168 B2 | 1/2008 | Su Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 * | 1/2011 | Mizoguchi ................ 257/786 |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 * | 6/2011 | Di Stefano ..................... 439/66 |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 * | 2/2012 | Mizoguchi ..................... 438/17 |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,346 B2 | 9/2013 | Rathburn |
| 8,536,714 B2 | 9/2013 | Sakaguchi |
| 8,536,889 B2 * | 9/2013 | Nelson et al. ............ 324/754.01 |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0125500 A1 | 6/2006 | Watkins et al. |

(56) References Cited

U.S. PATENT DOCUMENTS

| | | |
|---|---|---|
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Response to Restriction Requirement filed Mar. 7, 3013 in co-pending U.S. Appl. No. 13/318,200, now published as US Patent Application Publication No. US 2012/0056332.

Amendment and Response filed Mar. 4, 2013 in co-pending U.S. Appl. No. 13/318,263, now published as US Patent Application Publication No. US 2012/0043667.

Co-pending U.S. Appl. No. 13/879,783 titled High Performance Electrical Circuit Structure, filed Apr. 16, 2013.

(56) References Cited

OTHER PUBLICATIONS

Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Response to Restriction Requirement filed Jul. 15, 2013 in co-pending U.S. Appl. No. 13/266,486, now published as US Patent Application No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.

Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Co-pending U.S. Appl. No. 13/575,368, titled High Speed Backplane Connector, filed Jul. 26, 2012.
Co-pending U.S. Appl. No. 13/700,639 titled Electrical Connector Insulator Housing, filed Nov. 28, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.

(56) References Cited

OTHER PUBLICATIONS

Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.

(56) References Cited

OTHER PUBLICATIONS

Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.

Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.

(56) References Cited

OTHER PUBLICATIONS

Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Print—Definition of Print by The Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.

(56) References Cited

OTHER PUBLICATIONS

Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/U52010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.

\* cited by examiner

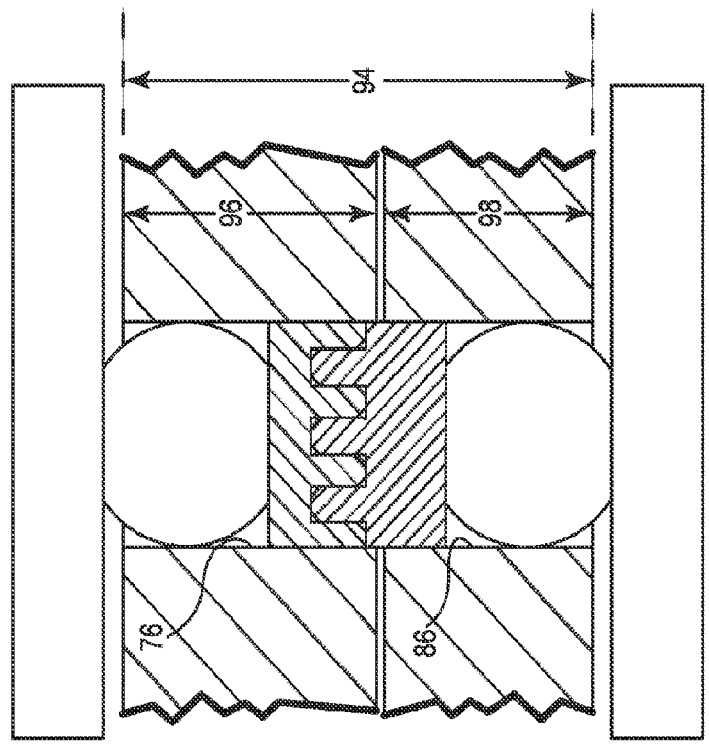
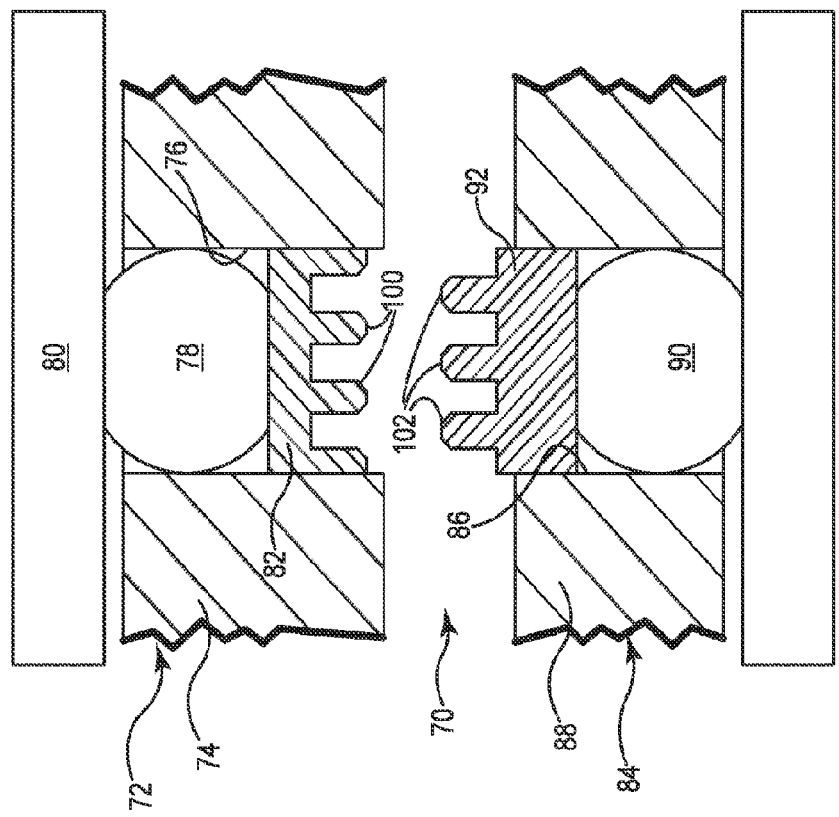

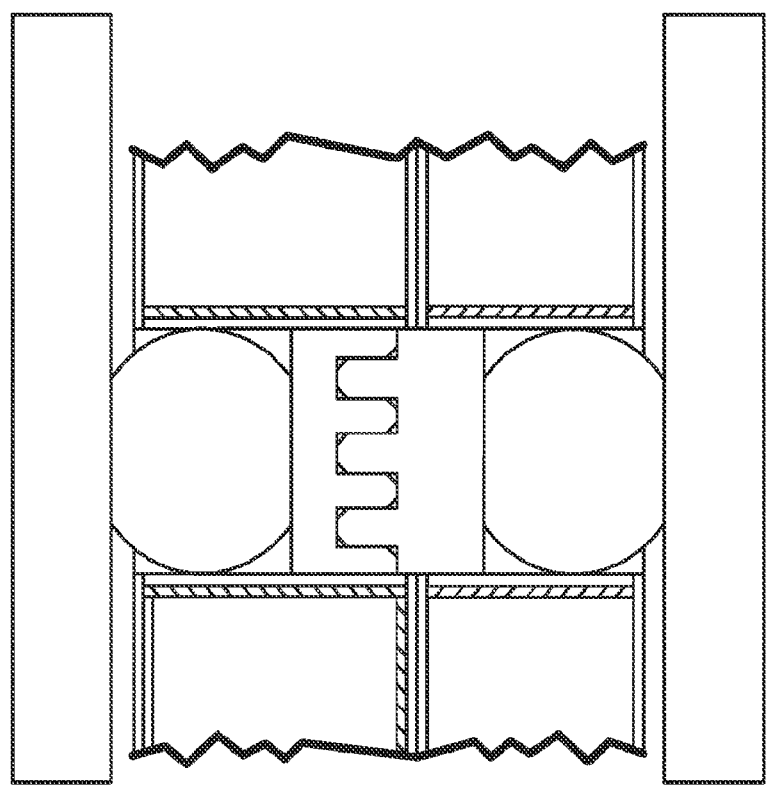
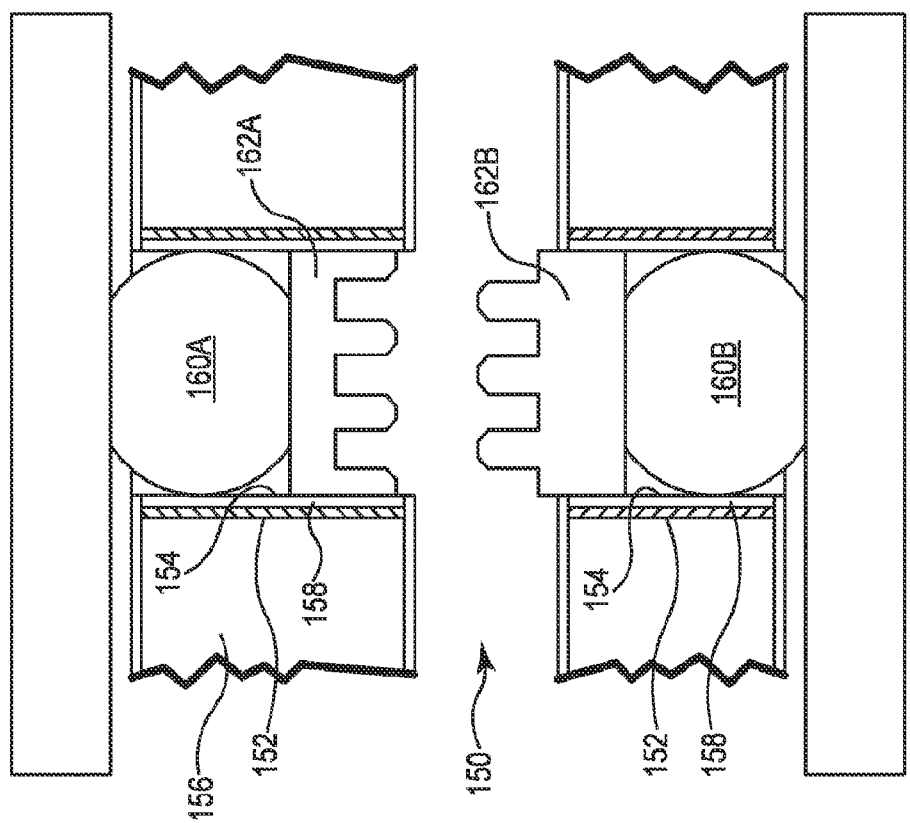
Fig. 4A
Fig. 4B

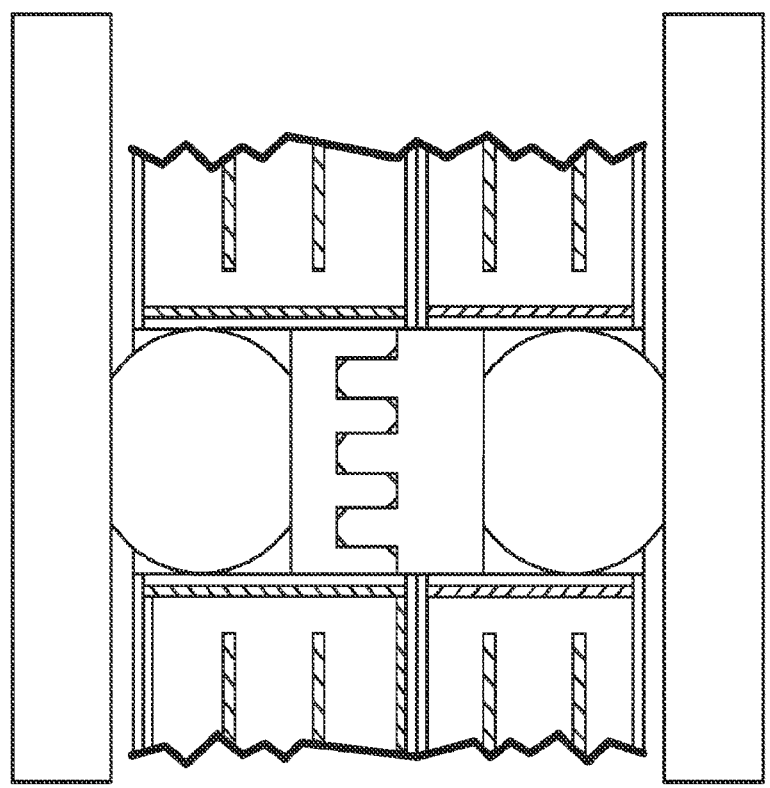
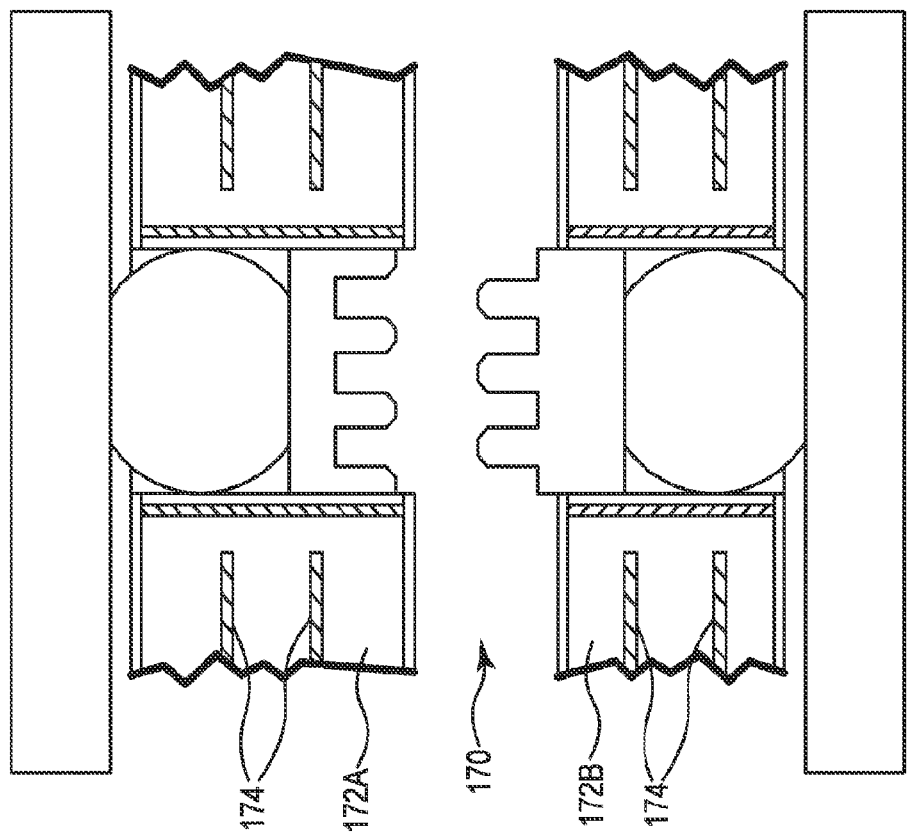
Fig. 5A
Fig. 5B

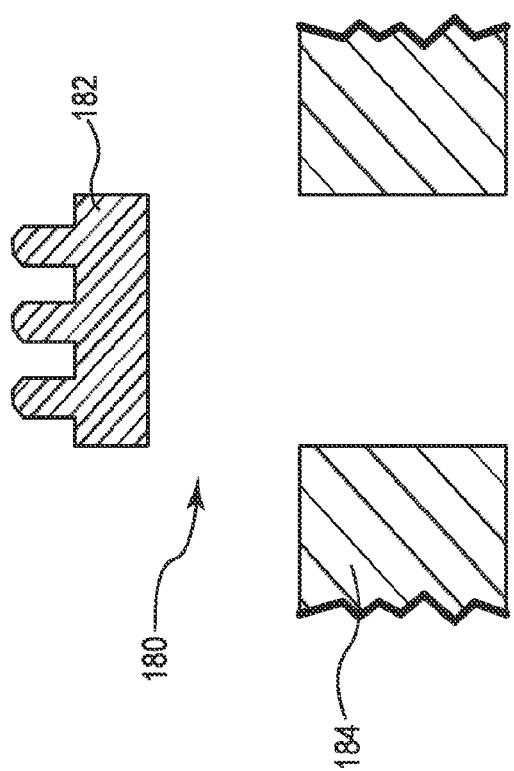

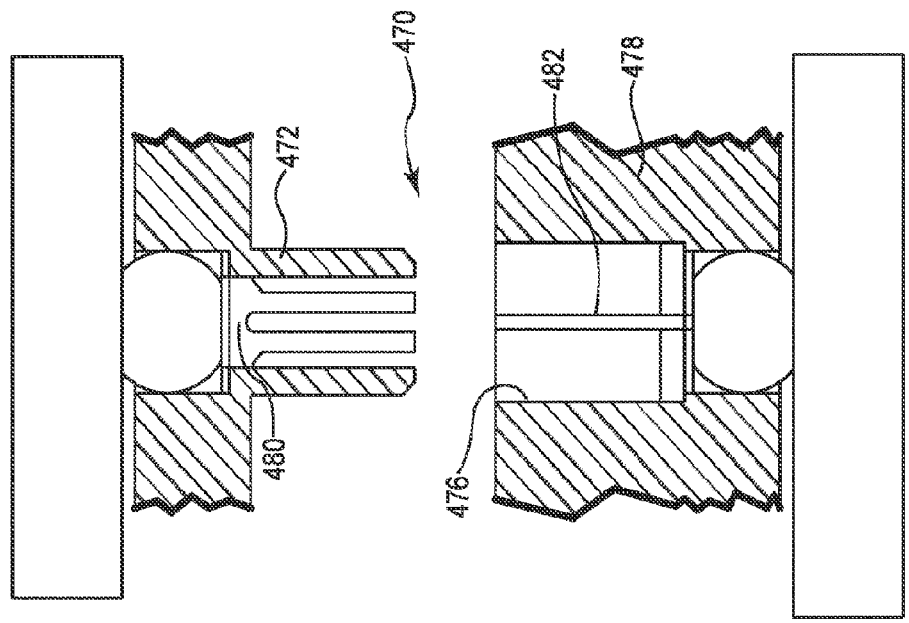
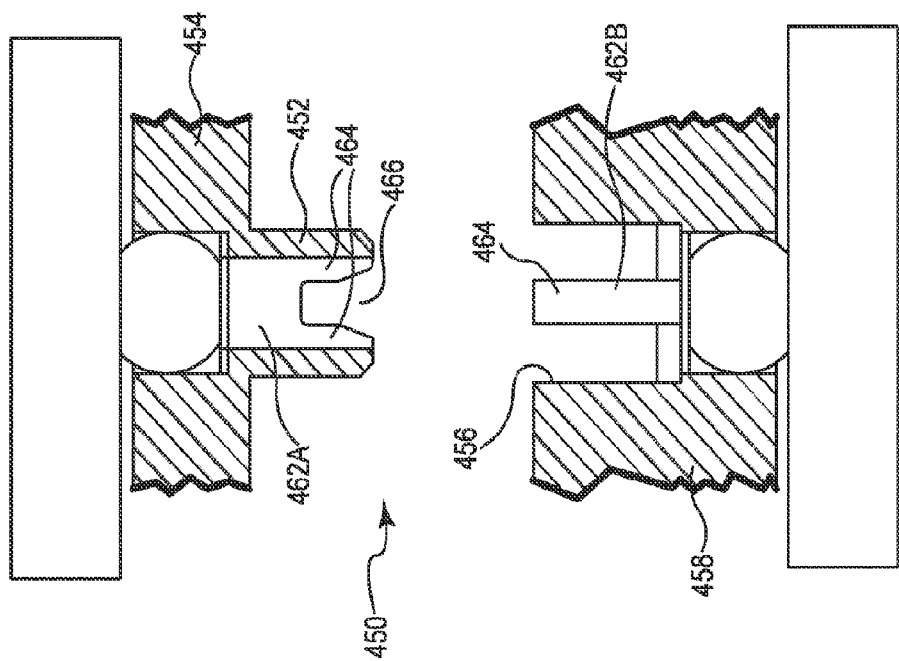

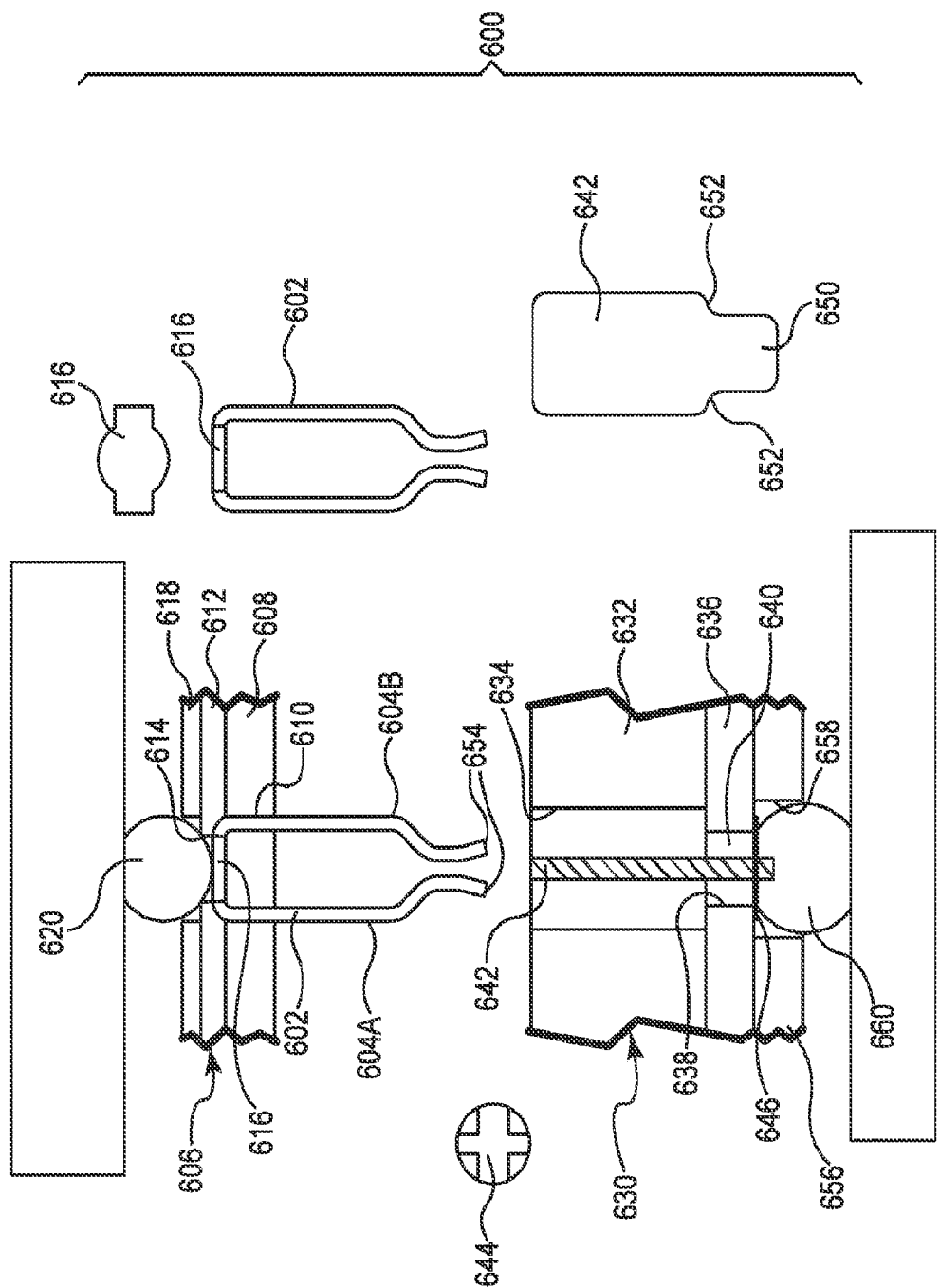

SEMICONDUCTOR DEVICE PACKAGE ADAPTER

CROSS-REFERENCE TO RELATED APPLICATIONS

This application claims the benefit of a national stage application under 35 U.S.C. §371 of International Application No. PCT/US2011/033726, titled SEMICONDUCTOR DEVICE PACKAGE ADAPTER, filed Apr. 25, 2011, which claims priority to U.S. Provisional Application No. 61/327,795, filed Apr. 26, 2010, all of which are hereby incorporated by reference in their entireties.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C. §371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,200, title COMPLIANT PRINTED CIRCUIT WAFER LEVEL SEMICONDUCTOR PACKAGE, filed Oct. 31, 2011, which is a national stage application under 35 U.S.C. §371 of International Application No. PCT/US2010/036288, titled COMPLIANT PRINTED CIRCUIT WAFER LEVEL SEMICONDUCTOR PACKAGE, filed May 27, 2010, which claims priority to U.S. Provisional Application No. 61/183,356, filed Jun. 2, 2009, all of which are hereby incorporated by reference in their entireties.

This application is a continuation-in-part of U.S. patent application Ser. No. 13/320,285, titled COMPLIANT PRINTED FLEXIBLE CIRCUIT, filed Nov. 14, 2011, which is a national stage application under 35 U.S.C. §371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, all of which are hereby incorporated by reference in their entireties.

TECHNICAL FIELD

The present application is directed to a high performance electrical interconnect between integrated circuits and the intended system circuit board in a removable manner through the use of a packaging adapter.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. The packages also serve to protect the fragile silicon or provide additional functions such as thermal management or near device decoupling. In many cases, the size and distance between die terminals is so small that the IC device cannot be connected to the final PCB without some sort of re-routing interface.

Historically, pin grid array packages ("PGA") were used for CPU devices. A socket was soldered to the motherboard and the field of pins extending out of the package was plugged into the socket. One advantage of a PGA is that the IC device can be removed from the socket if needed. The pin on PGA devices degrade signal performance. The pins are also expensive and are subject to damage during handling.

Land grid array ("LGA") packages are now used for many desktop and server applications, and ball grid array ("BGA") packages for direct soldering in notebook computers.

There are many types of connectors used to mate one circuit board to another. A LGA package acts essentially as one PCB and the mother board the other. These connections are made vertical in what is often called a mezzanine style. There are also various right angle connectors called backplane connectors. These consist of a male half and female half that are plugged together to make the connection. In relative terms, however, the size of the contacts used in the connectors is very large compared to those used in the LGA type CPU sockets.

One advantage of PGA devices is that the socket mechanically engages with the pin to secure the PGA package to the PCB. With LGA devices, on the other hand, a mechanism is required to apply a clamping pressure to hold the device against the socket contacts. These clamping mechanisms apply a fairly significant load to the system, and can cause circuit board warpage, broken solder joints, or flexing of the package. In many cases, a heat sink and fan assembly is added to the system by passing fasteners through the circuit board and mating with a stiffening member on the bottom side of the board.

Next generation LGA devices create many challenges due to the increased performance requirements, multi-core processors which drive the terminal count up, and low voltage differential signal architectures which can challenge terminal routing density. The IC device is much smaller than the associated package due to the need to fan out the pitch of the terminals so that the motherboard can be made cost effectively using standard four-layer technology. There is a need to shrink the pitch of the terminals so the package size can be reduced, as is done in cell phones and CPU sockets. The challenge is that it is very difficult to make a socket with contacts on a finer pitch that have enough compliance to accommodate the warpage of the package and provide stable contact resistance. It is also very difficult to route the pattern at the fine pitch and keep the PCB at four layers, unless a very expensive blind and buried via method is used.

BRIEF SUMMARY OF THE INVENTION

The present disclosure is directed to a semiconductor device packaged adapter for electrically coupling contacts on a first circuit member to contacts on a second circuit member.

The adapter typically includes first and second substrates, each with arrays of terminals. Proximal ends of the first terminals on the first substrate are arranged to be soldered to the contacts on the first circuit member and proximal ends of the second terminals on the second substrate are arranged to be soldered to the contacts on the second circuit member. Complementary engaging structures located on distal ends of the first and second terminals engage to electrically and mechanically couple the first circuit member to the second circuit member.

In one embodiment, the adapter includes a first substrate with a plurality of first terminals. Proximal ends of the first terminals are arranged to be soldered to the contacts on the first circuit member. The second substrate includes a plurality of second terminals. Proximal ends of the second terminals are arranged to be soldered to the contacts on the second circuit member. Complementary engaging structures are located on distal ends of the first and second terminals that engage to electrically and mechanically couple the first circuit member to the second circuit member.

In one embodiment, recesses are located in the first substrate at proximal ends of the first terminals. The recesses are preferably sized to receive solder balls on the first circuit member. Recesses can also be provided in the second substrate at proximal ends of the second terminals to receive solder balls on the second circuit member.

The first and second substrates can be multi-layered structures where the layers include one of a ground plane, a power plane, or shielding. Electrical shielding covered by a dielectric material optionally surrounds at least the first terminals.

Electrical devices are optionally located in or on one or more of the first and second substrates. The electrical devices can be discrete structures attached to the substrate or printed directly on the substrate. In one embodiment, at least one electrical device is printed on the first or second substrate and electrically coupled to at least one terminal.

The adapter can include routing traces on one or more of the first and second substrates to change the pitch between the proximal ends and distal ends of the terminals.

The terminals can be discrete structures attached to the substrate or a conductive material printed in recesses in the first and second substrates. The conductive material can include one of sintered conductive particles or a conductive ink.

The engaging structures can optionally extend above the substrate. In one embodiment, distal ends of the first terminals can include at least one flexible beam configured to flex in response to engagement with distal ends of the second terminals. Guide features can be located on the first substrate near distal ends of the first terminals. Recesses on the second substrate are locate near distal ends of the second terminals and configured to receive the guide features on the first substrate.

The present disclosure is directed to a method of electrically coupling contacts on a first circuit member to contacts on a second circuit member. The method includes soldering proximal ends of first terminals on a first substrate to the contacts on the first circuit member. Proximal ends of second terminals on a second substrate are soldered to the contacts on the first circuit member. The complementary structures located at distal ends of the first and second terminals are engaged to electrically and mechanically couple the first circuit member to the second circuit member.

The method optionally includes locating solder balls on the first circuit member in recesses in the first substrate at proximal ends of the first terminals. Solder reflow electrically and mechanically couples the first circuit member to the first substrate.

The method also includes depositing one or more of a ground plane, a power plane, or shielding on at least one of the first and second substrates. Electrical shielding covered by a dielectric material is optionally located around at least the first terminals. The method also includes printing electrical devices on one or more of the first and second substrates.

Routing traces can be added to one or both substrates to change the pitch between the proximal ends and distal ends of the terminals. The terminal can be printed directly to the substrates. In one embodiment, portions of the engaging structure flexes when coupled to the complementary engaging structure on the other substrate.

The present method permits a precise tuning of the impedance of the conductive path so that it matches the system impedance as best as possible to limit the electrical parasitic effects of the conductors. The terminals can also be shielded to prevent cross talk.

Many additional electrical devices can be added to the present adapter, such as for example, decoupling capacitance, power delivery, shielding, memory, transistors, and the like to increase function and performance, while potentially reducing the complexity of the PCB. Overall, the argument could be made that if the adapter could be made low enough cost, it could pay for itself with the system improvements and shrink of the package and socket footprint. The present adapter makes it unnecessary to redesign the entire system every time a new package comes out, or they can populate many different versions into one adapter by changing the routing on the top half and plugging into a common bottom half.

The Restriction of Hazardous Substances Directive ("ROHS") regulations regarding lead can be addressed by having non-lead solder on the adapter and lead based solder on the package which dramatically reduces the reflow temperature, increases reliability and eliminates tin whisker growth which can cause shorts between terminals. There are many other advantages, such as for example, increased flatness and build-to-order assembly, provided the present adapters can be made with low enough cost in high volume.

The same adapter can be used on any system with medium to large pin count BGA devices that are soldered to the system board. Hundreds of millions of dollars worth of recalls have been seen due to BGA devices between Microsoft and Nvidia alone. Large devices made by Xilinx and Altera are very expensive, difficult to solder and very difficult to rework. Graphics chips, Digital Signal Processors, Chipsets etc. could all be pluggable, made smaller, occupy less space on the system board and operate at high speed with the present adapter technology.

Historically, these BGA devices could not be socketed in the final system due to the fact that when contacts engage with the solder ball, the solder creeps away from the ball over time and the connection deteriorates over time. With the present adapter scheme, defective BGA devices can be removed from the PCB. Test facilities can use the mating half of the adapter to run at speed functional test and eliminate the need for test sockets and expensive load boards. The same type of construction can be used for Mezzanine and Backplane connectors, dramatically increasing the overall potential market.

Test circuitry and software can be embedded into the present adapter to provide intelligent function and the fine feature capability of the process may enable the silicon dies themselves to be attached directly to the adapter eliminating the BGA package altogether and creating a "Pluggable Package".

Regardless of whether a high volume product is adopted for system use, there is a very large market for direct sale of the packaging adapters to companies who would like to plug their devices during development work prior to volume production.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

In one embodiment, the substrates include at least one dielectric layer selectively printed to create recesses for the terminals and/or routing traces. A conductive material is printed in the recesses forming the terminals or routing traces. Conductive plating is preferably added to one or more of the terminals or routing traces. The conductive material can be sintered conductive particles or a conductive ink. The use of additive printing processes permits conductive material, non-conductive material, and semi-conductive material to be located on a single layer.

In one embodiment, pre-formed conductive materials are located in the recesses. The recesses are than plated to form terminals and/or traces. In another embodiment, a conductive foil is pressed into at least a portion of the recesses. The conductive foil is sheared along edges of the recesses. The excess conductive foil not located in the recesses is removed and the recesses are plated to form terminals and/or traces.

The present disclosure is also directed to several additive processes that combine the mechanical or structural properties of a polymer material, while adding metal materials in an unconventional fashion, to create routing traces and/or terminals that are refined to provide electrical performance improvements. By adding or arranging metallic particles, conductive inks, plating, or portions of traditional alloys, the compliant printed semiconductor package reduces parasitic electrical effects and impedance mismatch, potentially increasing the current carrying capacity.

The printing process permits the fabrication of functional structures, such as terminals, routing traces, and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The printing process is typically followed by a thermal treatment, such as in a furnace or with a laser, to achieve dense functionalized structures.

BRIEF DESCRIPTION OF THE SEVERAL VIEWS OF THE DRAWING

FIGS. 2A and 2B are cross-sectional views of an alternate semiconductor device package adapter in accordance with an embodiment of the present disclosure.

FIGS. 4A and 4B are cross-sectional views of an alternate semiconductor device package adapter with shielding in the substrate through holes in accordance with an embodiment of the present disclosure.

FIGS. 5A and 5B are cross-sectional views of an alternate semiconductor device package adapter with electrical devices in the substrate in accordance with an embodiment of the present disclosure.

FIG. 6 is a schematic illustration of a method of making a semiconductor device package adapter in accordance with an embodiment of the present disclosure.

FIG. 16 is a cross-sectional view of a semiconductor device package adapter with notched terminals oriented at 90 degrees in accordance with an embodiment of the present disclosure.

FIG. 17 is a cross-sectional view of a semiconductor device package adapter with an elongated blade in accordance with an embodiment of the present disclosure.

FIG. 22 illustrates an alternate semiconductor device package adapter with upper contacts formed with beams in accordance with an embodiment of the present disclosure.

DETAILED DESCRIPTION OF THE INVENTION

The present disclosure is directed to an adapter for BGA and LGA packages that can be plugged into a system PCB in a low cost, yet high performance manner, as an alternative to direct solder attachment or PGA substrates. The present adapter permits high performance in the range of about 5-8 GHz signal environment with targeted impedance of 50 ohm single ended.

Figure 1:
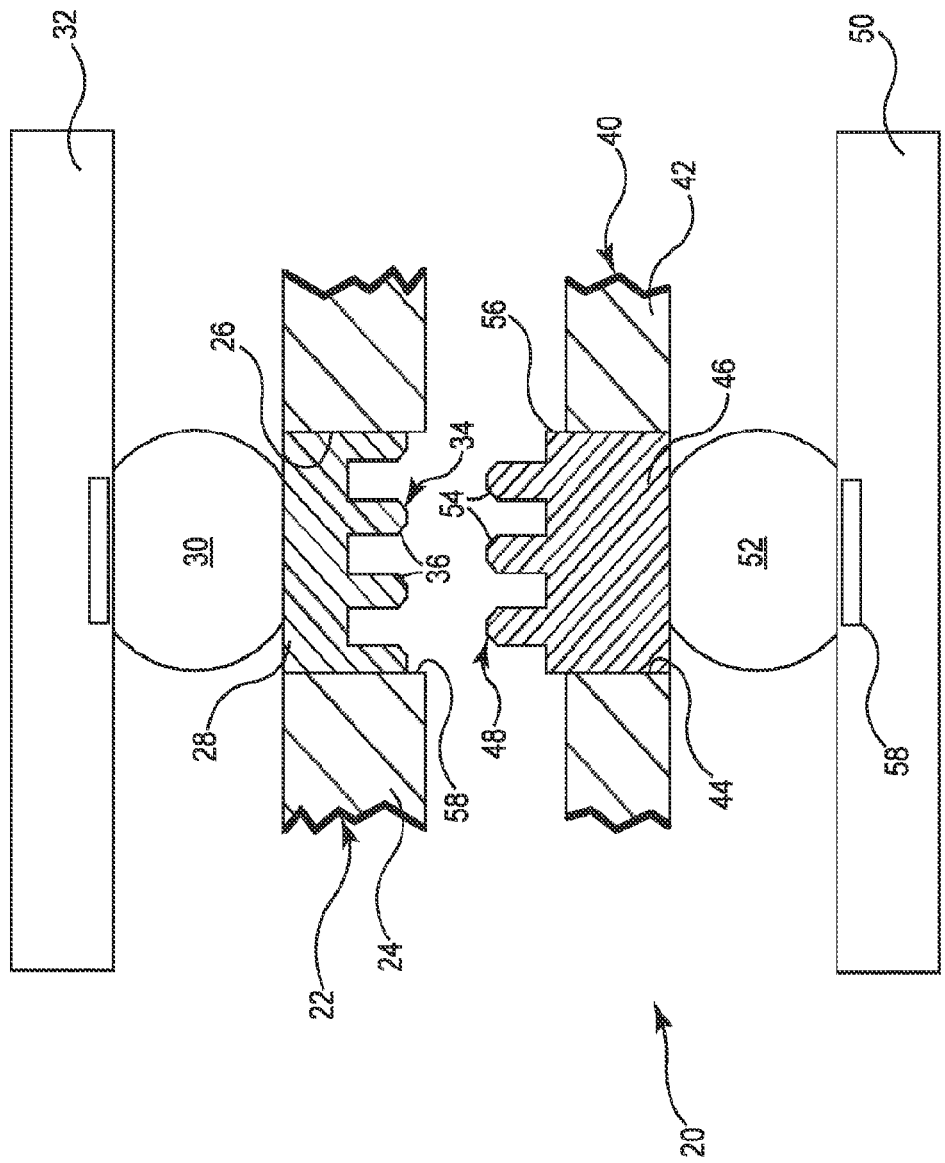
FIG. 1 is a cross-sectional view of a semiconductor device package adapter in accordance with an embodiment of the present disclosure.

FIG. 1 illustrates a semiconductor device package adapter 20 in accordance with one embodiment of the present disclosure. First portion 22 of adapter 20 includes substrate 24 fabricated with simple through-holes 26, that are populated with metallic terminals 28 arranged to correspond with solder balls 30 on BGA device 32. The BGA device 32 is soldered to terminals 28 embedded in the first portion 22 of the adapter 20.

Second portion 40 also includes substrate 42 with through holes 44, populated with metallic terminals 46 arranged to correspond with contact pads 58 on another circuit member 50, such as a PCB. The second portion 40 is typically soldered to the circuit member 50 using solder 52. As used herein, the term "circuit members" refers to, for example, a packaged integrated circuit device, an unpackaged integrated circuit device, a PCB, a flexible circuit, a bare-die device, an organic or inorganic substrate, a rigid circuit, or any other device capable of carrying electrical current.

The substrates 24, 42 may be constructed from a variety of rigid or flexible polymeric materials, such as for example, UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyester (PET), polyimide (PI), polyethylene napthalate (PEN), Polyetherimide (PEI), along with various fluropolymers (FEP) and copolymers, and Ryton® available from Phillips Petroleum Company. For some applications, the substrate can be a polyimide film due to their advantageous electrical, mechanical, chemical, and thermal properties.

Distal ends 34 of terminals 28 include engaging structures 36 that are complementary to engaging structures 54 on distal end 48 on terminals 46 to form a precise, multi-point, electrical connection. The first and second portions 22, 40 are mated with a vertical insertion that engages the engaging structures 36, 54 in a reliable manner that takes advantage of precision features that complement each other, without the need for significant flexure at the interfaces to reduce overall height of the interface. In the illustrated embodiment, the engaging structures 36, 54 include complementary protrusions that inter-engage to form a high surface area electrical connection. See e.g., FIG. 2B. Height of the engaging structures 36, 54 reduces the need for contact compliance and overall height. In one embodiment, the terminals 28 provide a 0.8 millimeter area array pitch with a 3×4 array of engaging structures 36.

In the illustrated embodiment, terminal 28 is recessed in substrate 24, while terminal 46 extends above substrate 42. In the mated configuration, shoulder 56 on terminal 46 is located in recess 58 to prevent side-loading of the engaging structures 36, 54.

FIG. 2A illustrates an alternate semiconductor device package adapter 70 in accordance with an embodiment of the present disclosure. First portion 72 includes substrate 74 with recesses 76 sized to receive solder ball terminals 78 on BGA device 80. Nesting the solder ball terminals 78 directly into the recesses 76 on the substrate 74 increases stability and reduces warpage during soldering. The recesses 76 also serve to guide the solder ball terminal 78 into intimate proximity to terminals 82 and to contain the solder 78 during reflow.

In some embodiments, second portion 84 also includes recesses 86 in substrate 88 to receive solder balls 90 and create intimate engagement with terminal 92. As best illustrated in FIG. 2B, recesses 76, 86 reduce the overall height 94 of the semiconductor device package adapter 70, while permitting an increase in thicknesses 96, 98 of the substrates 74, 88. FIG. 2B also illustrates inter-engagement of engaging structures 100, 102 on the respective terminals 82, 92.

Figure 3B:
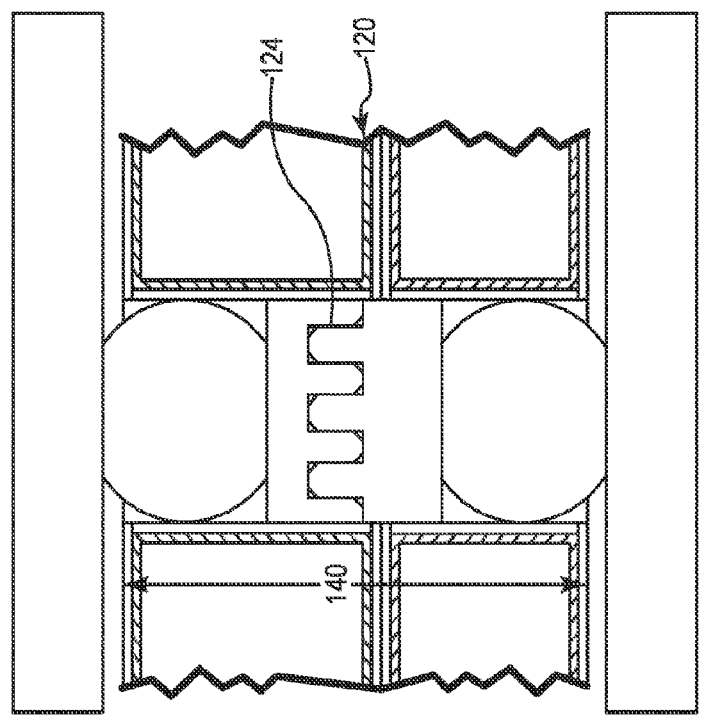
FIGS. 3A and 3B are cross-sectional views of an alternate semiconductor device package adapter with shielding layers in accordance with an embodiment of the present disclosure.
Figure 3A:
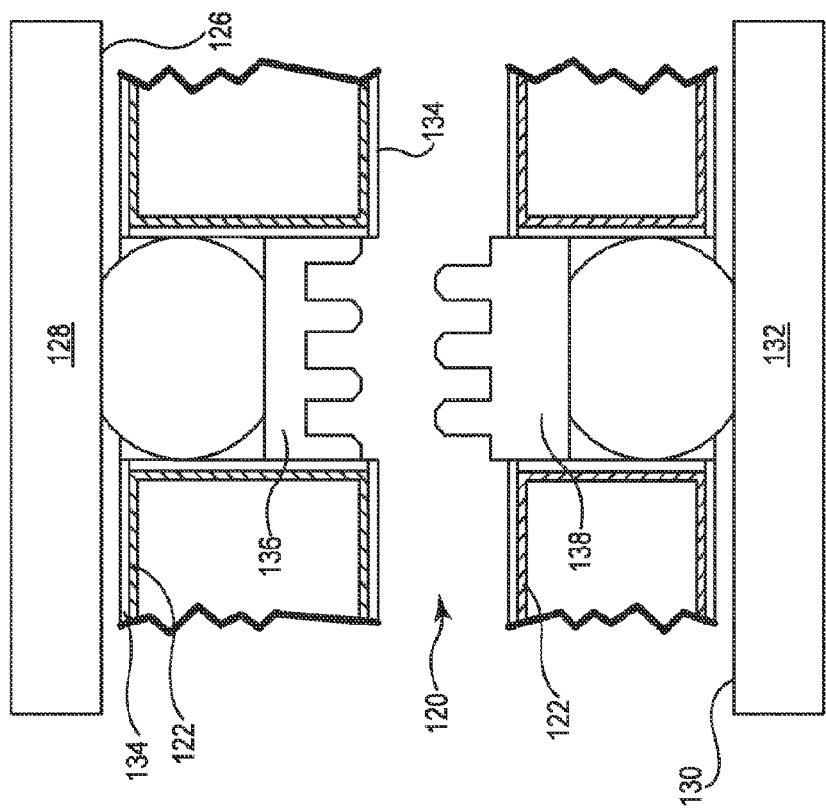

FIGS. 3A and 3B illustrate an alternate semiconductor device package adapter 120 that includes ground planes, power planes, and/or shielding layers 122 in accordance with an embodiment of the present disclosure. Dielectric material 134 preferably covers the layers 122. The layers 122 improve the electrical performance of the interface 124 and increase the ability to tune the impedance of the channel through the adapter 120, as well as shield cross talk impact from bottom 126 of the BGA device 128 substrate down to the surface 130 of the system PCB 132. The adapter 120 reduces the pitch of terminals 136, 138 to about 0.45 millimeters ("mm") with an overall height 140 of about 1.1 mm.

FIGS. 4A and 4B illustrate an alternate semiconductor device package adapter 150 that includes shielding layers 152 in through-holes 154 of the substrates 156 in accordance with an embodiment of the present disclosure. Dielectric material 158 preferably covers the shielding layers 152. The shielding layers 152 reduce cross talk within the holes 154, with the dielectric layer 158 preventing shorting between solder balls 160A, 160B and terminals 162A, 162B, and the shielding layers 152.

FIGS. 5A and 5B illustrate an alternate semiconductor device package adapter 170 that includes internal electrical devices 174 in accordance with an embodiment of the present disclosure. The substrates 172A, 172B can incorporate various internal electrical devices 174, such as for example, reference planes, decoupling capacitance, signal, ground and power routing, signal switching or equalization, RF antennae or shielding, internal transistors and memory devices, discrete passive or active devices, RF ID or security tags, optical and RF wave guides, thermal management, and the like.

In the embodiment of FIG. 6, the present adapter 180 can use several high volume processes where the terminals 182 are installed in the substrate 184 as discrete individual components, gang inserted, vibrated in place or into an assembly fixture, printed constructions, etched, embossed or imprinted features, and the like. Many terminal 182 shapes are possible, including etched, stamped, and/or formed features.

Figure 7:
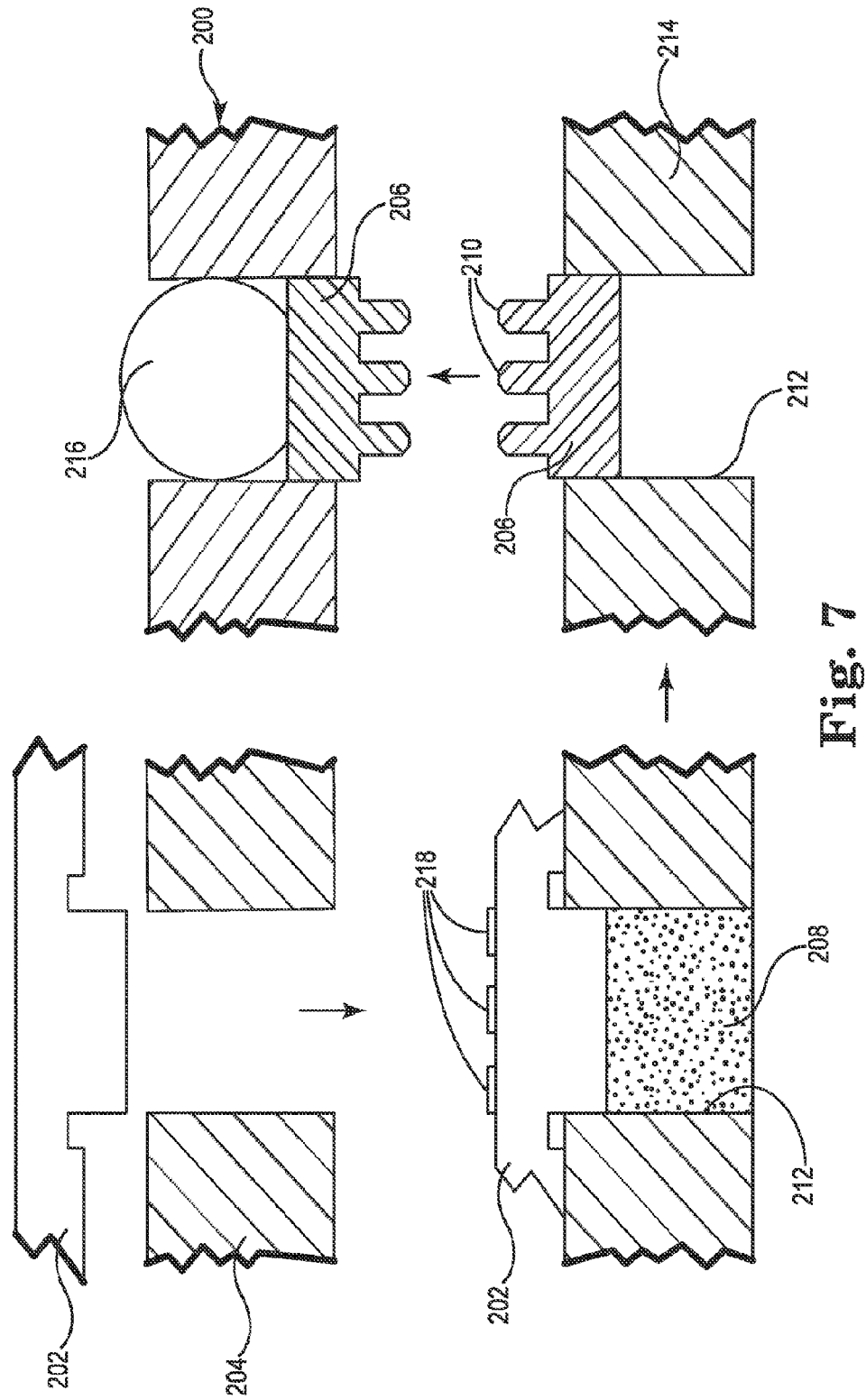
FIG. 7 is a schematic illustration of an alternate method of making a semiconductor device package adapter in accordance with an embodiment of the present disclosure.

FIG. 7 illustrates a method of mass producing a semiconductor device package adapter 200 in accordance with an embodiment of the present disclosure. Base metal layer 202 is mated with substrate 204. The terminals 206 are then mass processing by photo etching or chemical milling. In the illustrated embodiment, the base metal 202 is photo defined with mask 218 and etched to create the engaging structures 210.

The metal layer 202 seals the substrate 204 to prevent etchant from entering the through-holes 212. In one embodiment, through holes 212 are filled with mask 208. The patterns are etched, the through-holes 212 are unsealed and the assembly 214 is plated. The assembly 212 is flipped and solder balls 216 are added to the through holes 212 mated with the terminal 206 member. The etched engaging structures 210 have a natural taper due to the etching process that acts as a guide when mated with a complimentary terminal in the mating half of the adapter 200.

The terminal 206 can alternatively be formed by printing conductive particles followed by a sintering step, by printing conductive inks, or a variety of other techniques. The metal material is preferably of copper or similar metallic materials such as phosphor bronze or beryllium-copper. The resulting terminal 206 is optionally plated to improve conductive properties. The plating is preferably a corrosion resistant metallic material such as nickel, gold, silver, palladium, or multiple layers thereof.

In another embodiment, the adapter 200 can be processed in sheet, strip, or batch fashion, with the assemblies ganged together and singulated after assembly is completed, in accordance with an embodiment of the present disclosure.

Figure 8B:
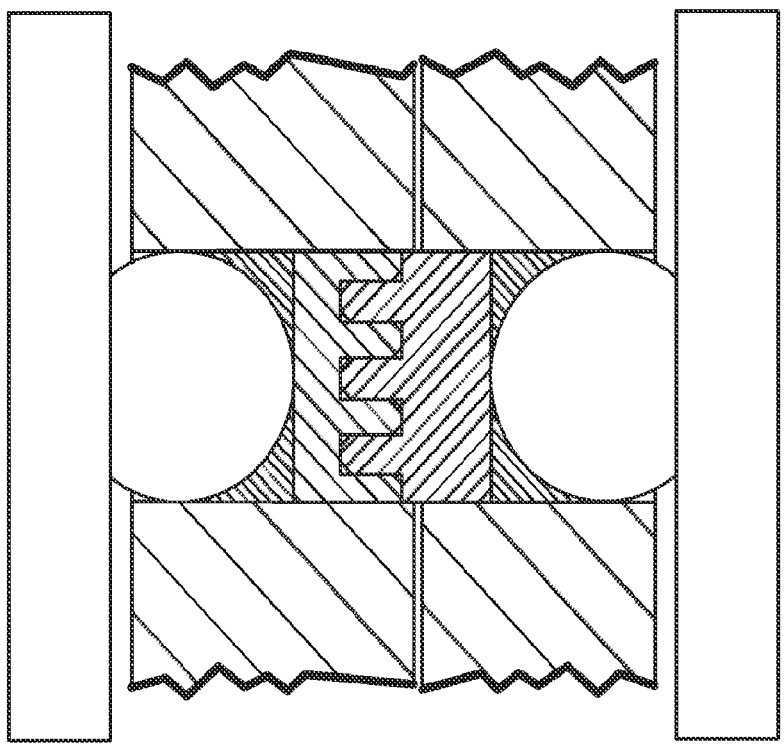
FIGS. 8A and 8B are cross-sectional views of a semiconductor device package adapter in accordance with an embodiment of the present disclosure.
Figure 8A:
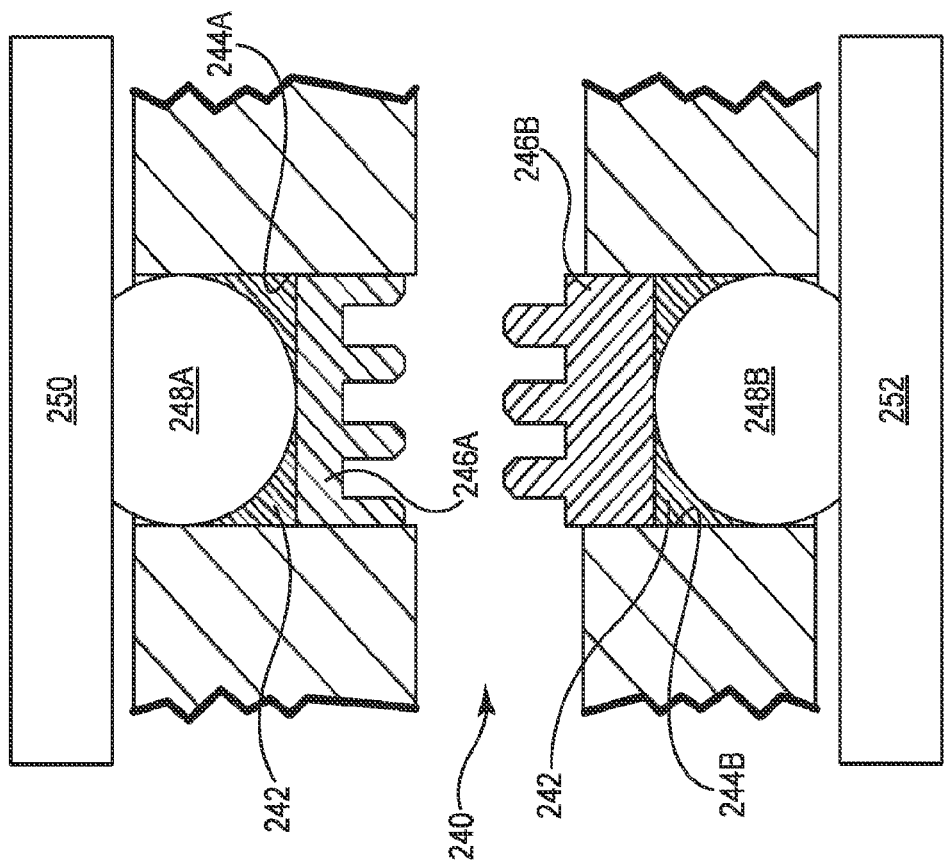

FIGS. 8A and 8B illustrate a semiconductor device package adapter 240 that does not require solder reflow, in accordance with an embodiment of the present disclosure. Conductive paste and/or adhesive 242 is located in the holes 244A, 244B to attach the terminals 246A, 246B to solder balls 248A, 248B on the BGA device 250 and the PCB 252. The embodiment of FIGS. 8A and 8B can be used with packaged BGA devices 250 or with direct die attachment.

Figure 9:
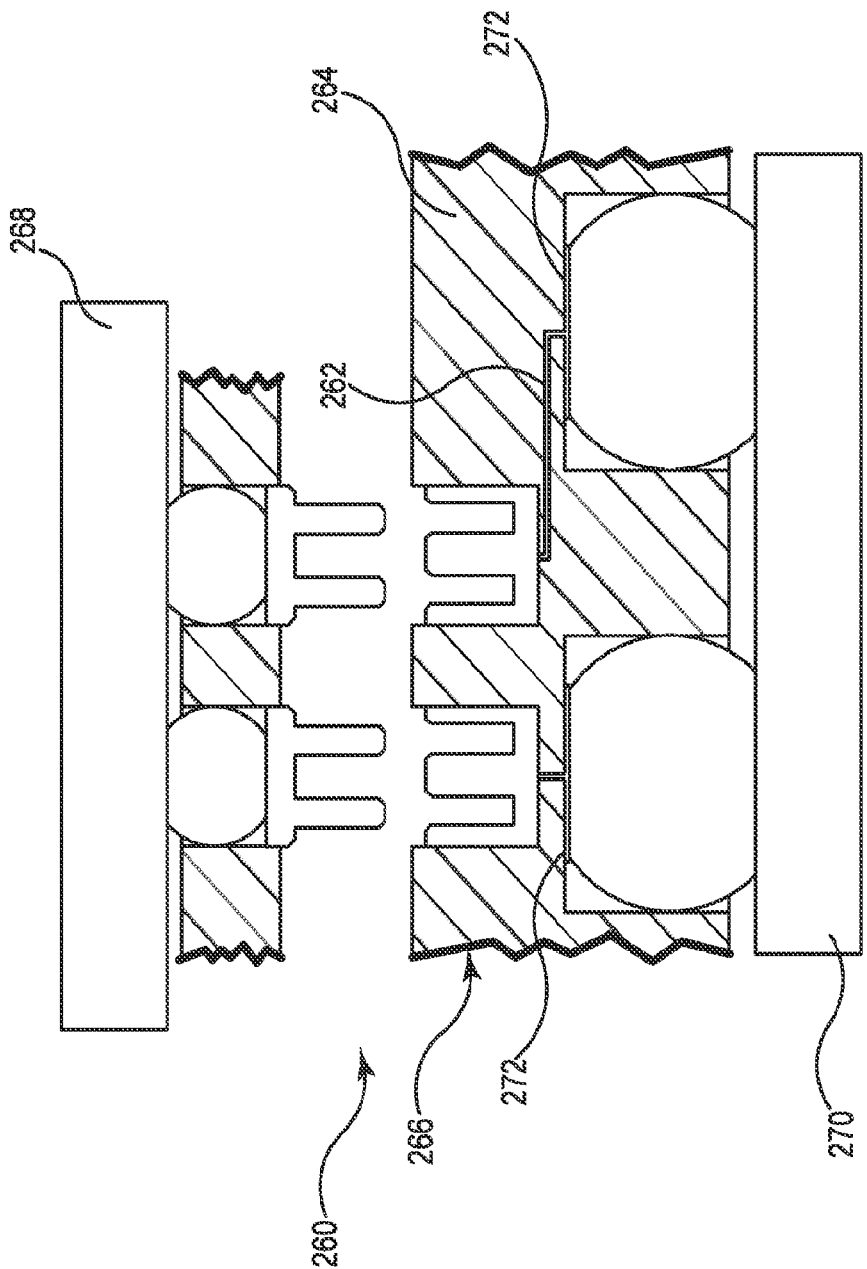
FIG. 9 is a cross-sectional view of a semiconductor device package adapter with routing traces in the substrate in accordance with an embodiment of the present disclosure.

FIG. 9 illustrates a semiconductor device package adapter 260 with routing traces 262 in accordance with an embodiment of the present disclosure. The routing traces 262 are located in substrate 264 of second portion 266. In the illustrated embodiment, the adapter 260 accepts a 0.4 mm pitch BGA device 268 and interconnects to 0.8 mm pitch PCB 270. The routing traces 262 are preferably about 0.001 inches wide by 0.001 inches thick. The routing traces 262 are preferably connected to metalized pads 272, which are about 0.001 inches thick.

In one embodiment, the routing traces 262 are formed by depositing a conductive material in a first state in the recesses, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

Figure 10:
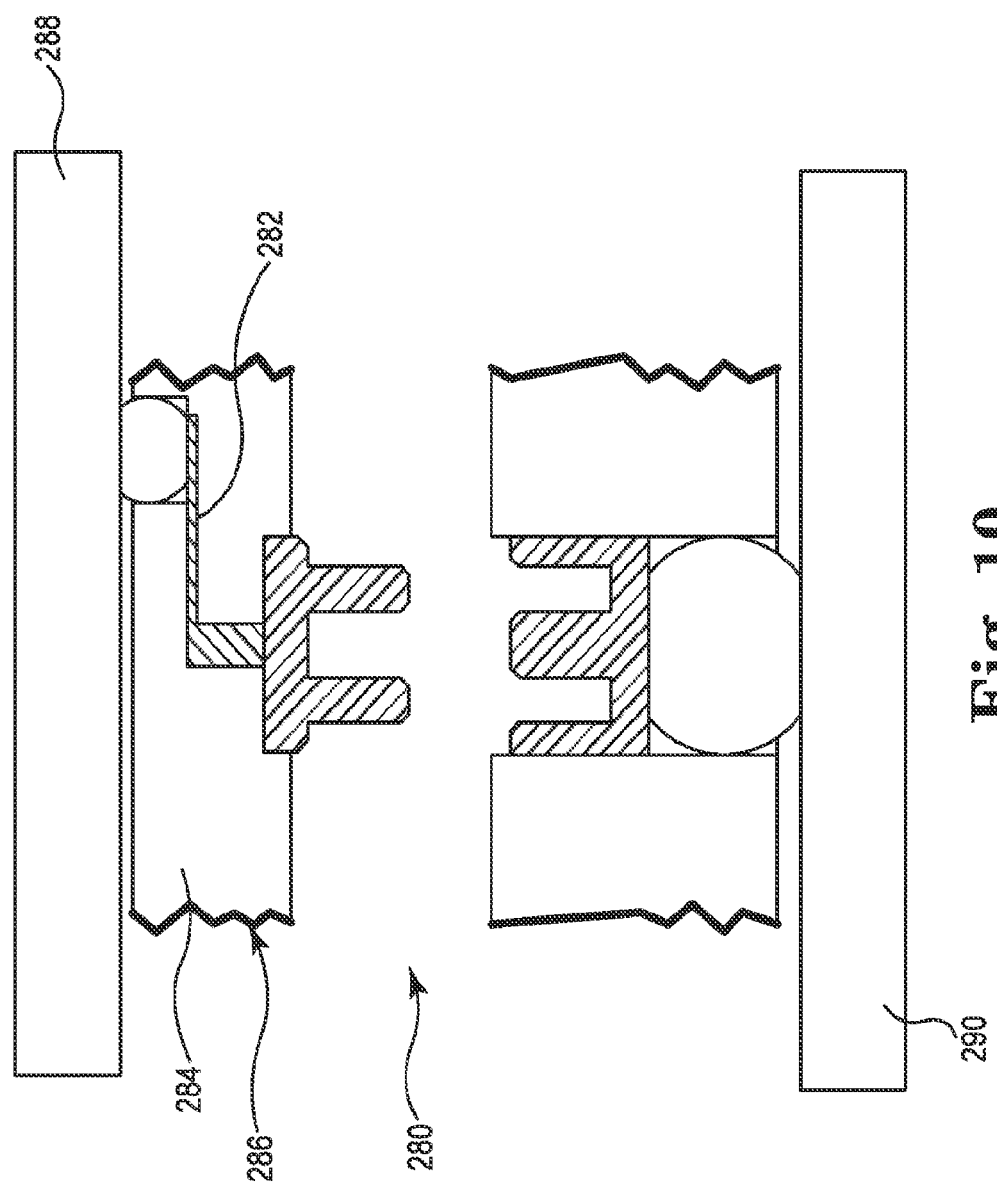
FIG. 10 is a cross-sectional view of an alternate semiconductor device package adapter with routing traces in the substrate in accordance with an embodiment of the present disclosure.

FIG. 10 illustrates an alternate semiconductor device package adapter 280 with routing traces 282 in accordance with an embodiment of the present disclosure. The routing traces 282 are located in substrate 284 of first portion 286. The embodiment of FIG. 10 allows for the BGA device 288 to be shrunk to 0.4 mm pitch, while maintaining the 0.8 mm pitch on the PCB 290.

Figure 11:
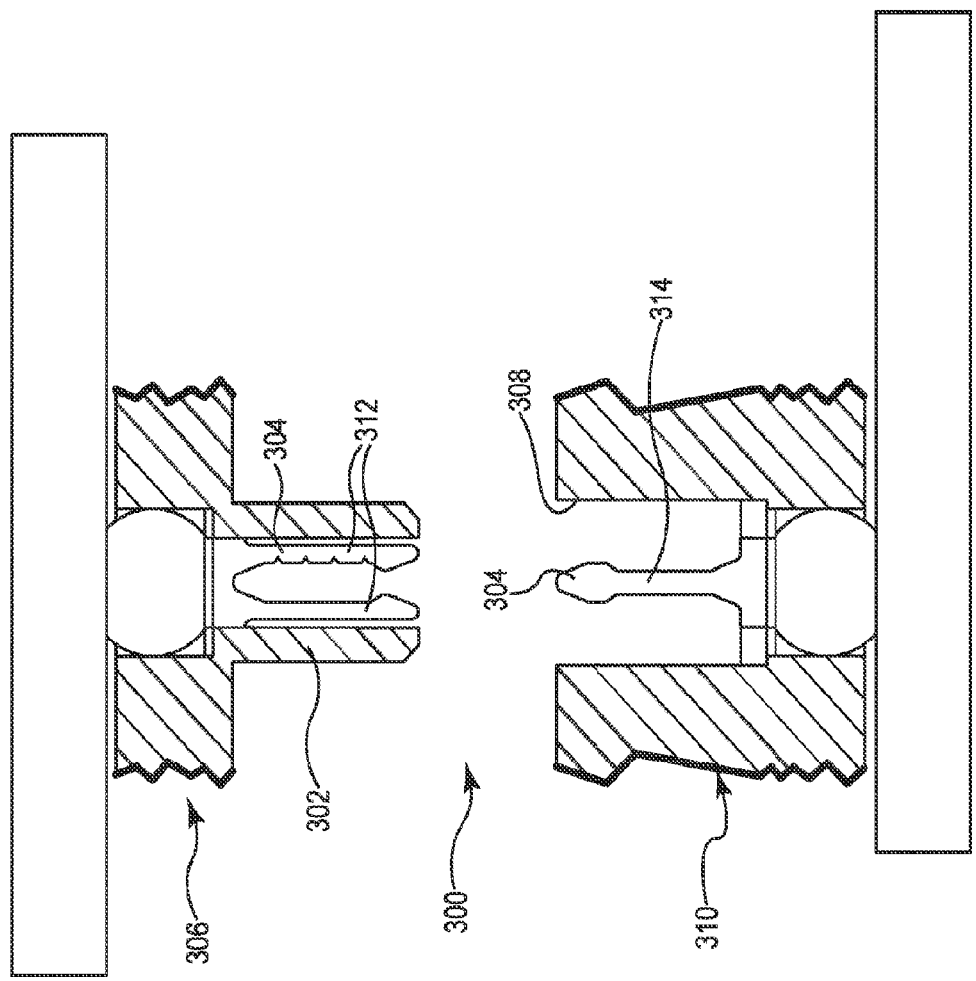
FIG. 11 is a cross-sectional view of a semiconductor device package adapter with terminals having flexible beams in accordance with an embodiment of the present disclosure.

FIG. 11 illustrates an alternate semiconductor device package adapter 300 with guide features 302 that protect engaging structures 304 in accordance with an embodiment of the present disclosure. The guide features 302 are preferably molded as part of the first portion 306. The guide features 302 are sized to engage with recesses 308 in second portion 310. In the illustrated embodiment, the guide features 302 are configured to allow beams 312 of the engaging structure 304 to flex slightly when engaged with the lower blade 314. In one embodiment, the beams 312 and the lower blades 314 are press-fit into their respective portion 306, 310.

Figure 12:
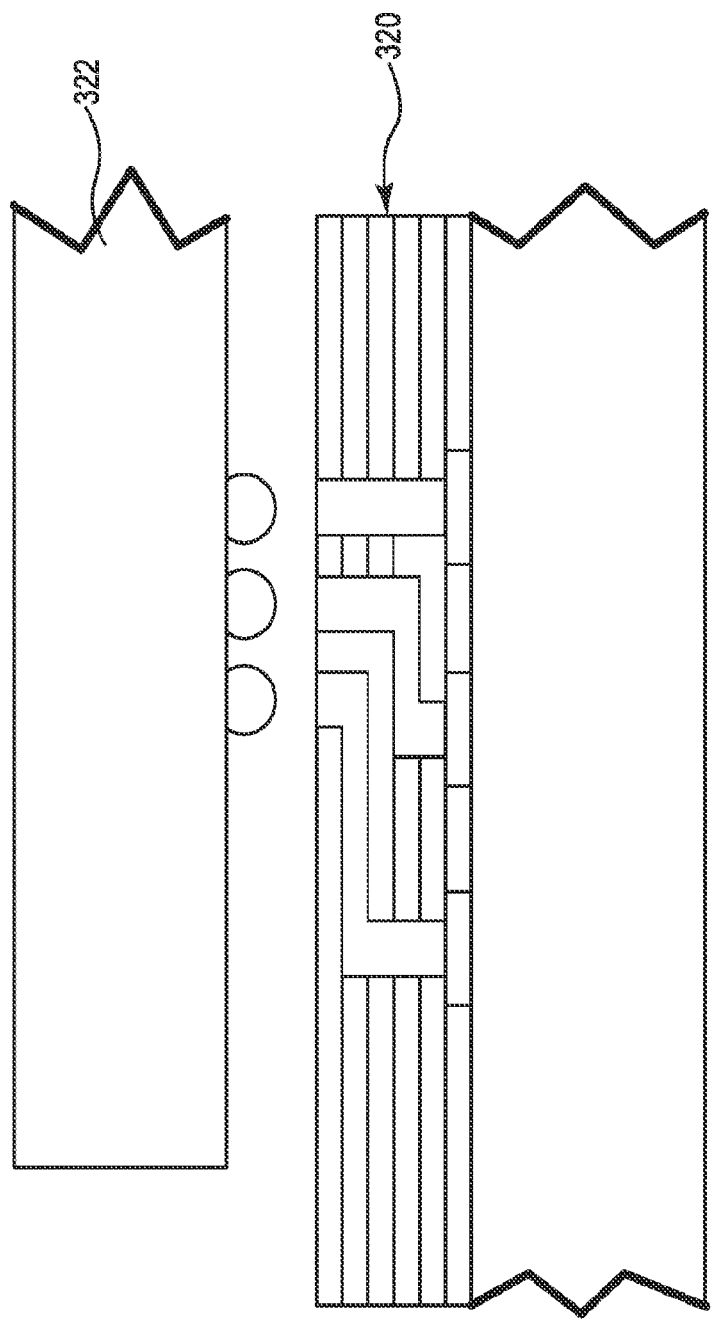
FIG. 12 is a cross-sectional view of a semiconductor device package adapter with routing traces in the substrate in accordance with an embodiment of the present disclosure.

FIG. 12 illustrates routing redistribution 320 with packaged BGA device 322 in accordance with an embodiment of the present disclosure. The routing redistribution 320 can be located internally in the BGA device 322, or in the first or second portions of the present semiconductor device package adapter, such as disclosed in PCT/US10/36363, entitled Compliant Printed Circuit Area Array Semiconductor Device Package, filed May 27, 2010, which is hereby incorporated by reference.

Figure 13:
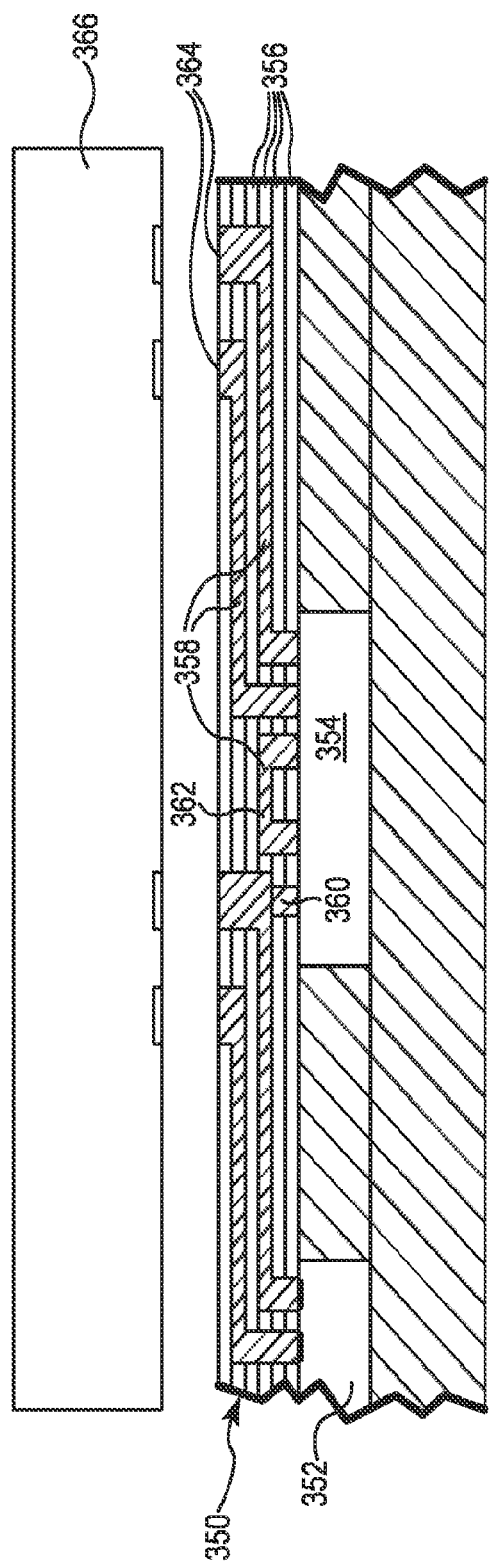
FIG. 13 illustrates a multichip compliant printed semiconductor package in accordance with an embodiment of the present disclosure.

FIG. 13 illustrates a semiconductor package 350 that simulates a system in package (SIP) or multichip module format, in accordance with an embodiment of the present disclosure. Multiple IC devices 352, 354 are located in the semiconductor package 350. Dielectric layers 356 and circuit geometry 358 are printed as discussed herein. The circuit geometry 358 permits inter-die circuit paths 360 and intra-die circuit paths 362. Contact pads 364 can be configured in a variety of ways to couple with circuit member 366.

Figure 14:
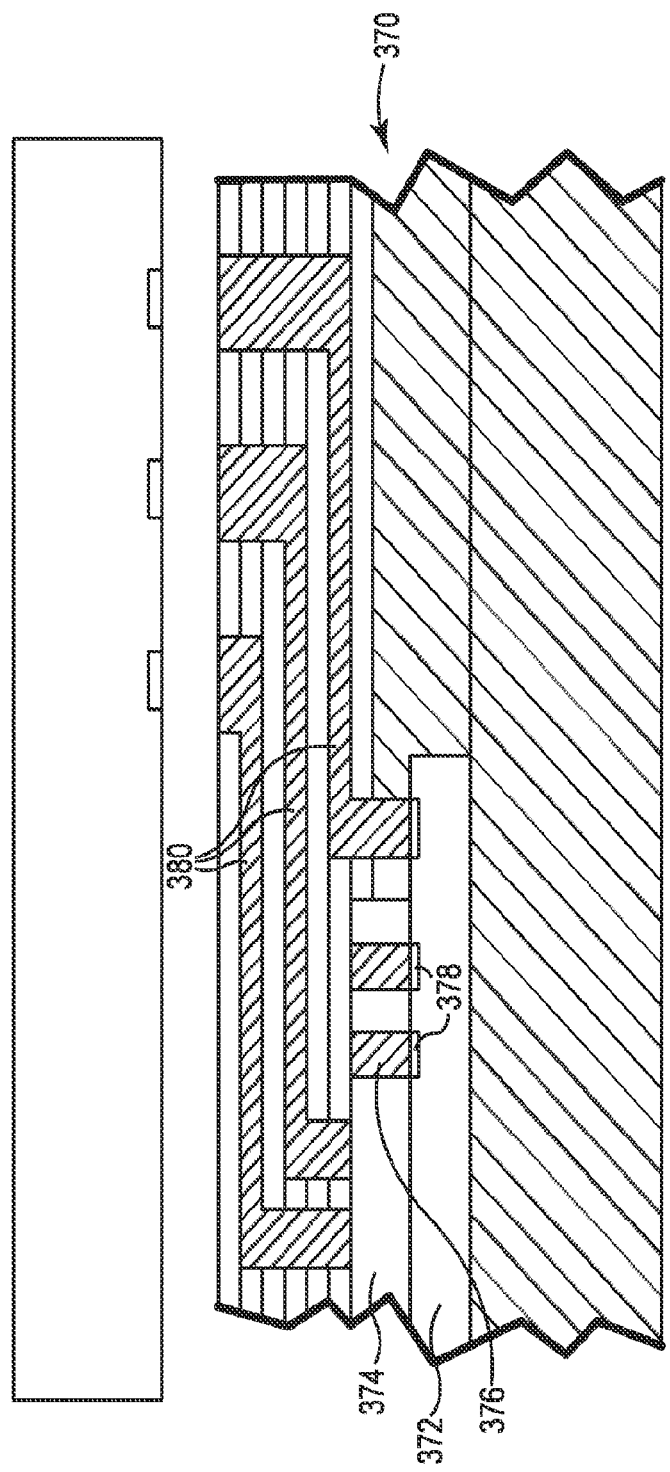
FIG. 14 illustrates a stacked multichip compliant printed semiconductor package in accordance with an embodiment of the present disclosure.

FIG. 14 illustrates a semiconductor package 370 with stacked IC devices 372, 374 in accordance with an embodiment of the present disclosure. Through silicon vias 376 permit contact pads 378 on IC device 372 to electrically couple with circuit geometry 380 and/or IC device 374. The through silicon vias 376 eliminate edge wiring and permit a shorter vertical stack. The through silicon vias 376 can be formed using the printing processes discussed herein or other methods.

Figure 15:
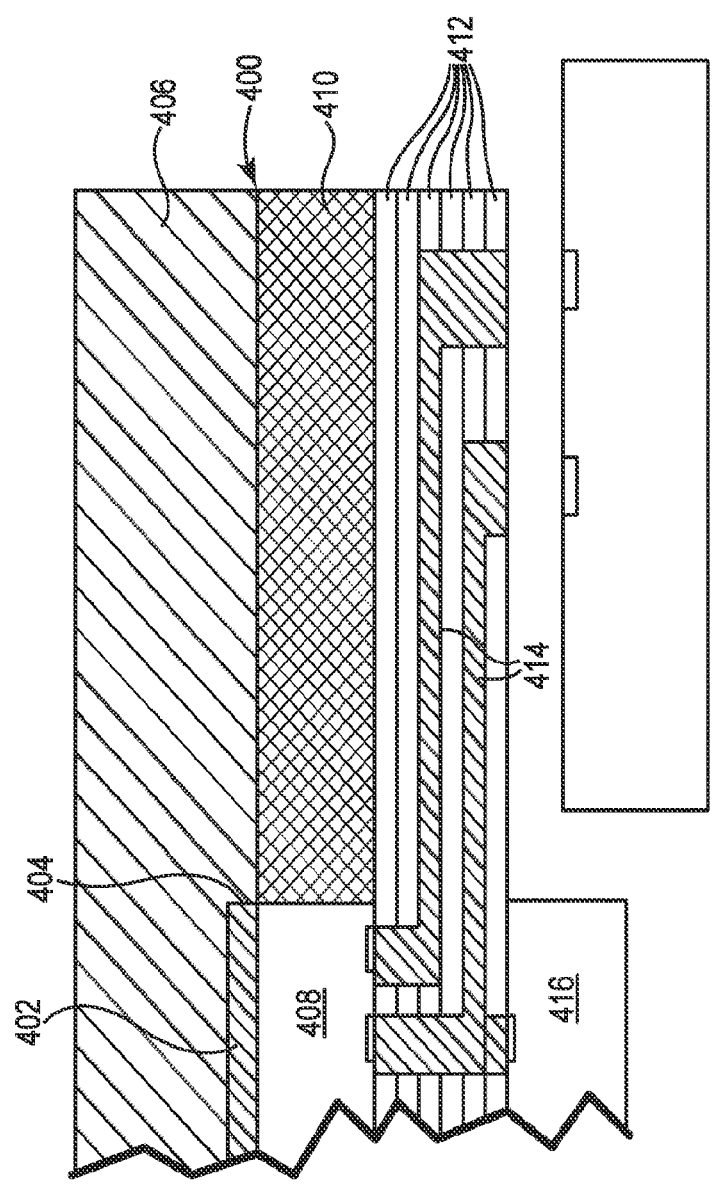
FIG. 15 illustrates a layered multichip compliant printed semiconductor package in accordance with an embodiment of the present disclosure.

FIG. 15 illustrates an alternate semiconductor package 400 in accordance with an embodiment of the present disclosure. RF shielding 402 is optionally printed in recess 404 of substrate 406. In one embodiment, substrate 406 is optimized for thermal management. In another embodiment, IC device 408 is retained to substrate 406 by overmolding or encapsulation 410.

Dielectric layers 412 and circuit geometry 414 are preferably printed as discussed below. In the embodiment of FIG. 15, the circuit geometry 414 is configured to add additional IC device 416 in a double sided configuration. Alternatively, the semiconductor package 400 can be mated with another assembly to create a complex system in package or multi-chip module.

In one embodiment, the terminals and the electric devices are printed during construction of the present semiconductor device package adapter. The electrical devices can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices can be formed using printing technology, adding intelligence to the semiconductor device package adapter. Features that are typically located on the BGA device can be incorporated into the semiconductor device package adapter in accordance with an embodiment of the present disclosure.

The availability of printable silicon inks provides the ability to print the terminal and electrical devices, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The terminals and electrical devices can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

The terminals can be printed with metals, such as aluminum or gold, or conductive polymers, such as polythiophene or polyaniline. The terminals may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

FIG. 16 illustrates an alternate semiconductor device package adapter 450 with molded guide features 452 in accordance with an embodiment of the present disclosure. The guide features 452 are preferably molded as part of the first substrate 454. The guide features 452 are sized to engage with recesses 456 in second substrate 458. The terminal 462A 462B ("462") each include a pair of blades 464 separated by notch 466. The terminals are located 90 degrees from each other so they nest in the notches 466 when engaged. In one embodiment, the guide features 452 flex during engagement of the terminals 462.

FIG. 17 illustrates an alternate semiconductor device package adapter 470 with molded guide features 472 in accordance with an embodiment of the present disclosure. The guide features 472 are sized to engage with recesses 476 in second substrate 478. The terminal 480 includes a pair of flexible beams, while the terminal 482 is a 90-degree offset blade structure that extends all the way across the recess 476. In one embodiment, the guide features 472 flex during engagement of the terminals 480, 482.

Figure 18:
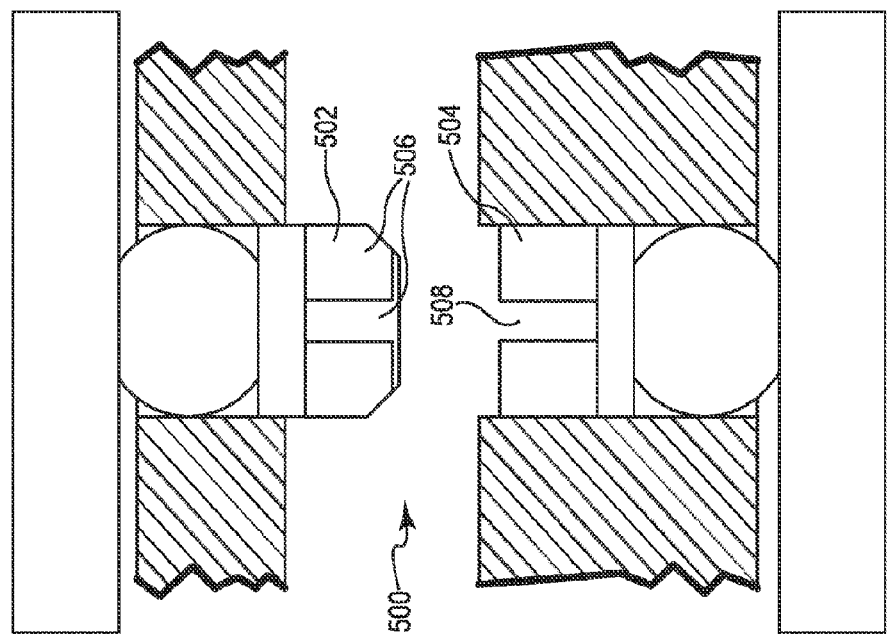
FIG. 18 is a cross-sectional view of a semiconductor device package adapter with a cross-shaped interface between the terminals in accordance with an embodiment of the present disclosure.

FIG. 18 illustrates an alternate semiconductor device package adapter 500 with cross-shaped engaging structures 502, 504 in accordance with an embodiment of the present disclosure. The engaging structure 502 includes a cross-shaped protrusion 506, while the engaging structure 504 includes complementary cross-shaped recesses 508.

Figure 19:
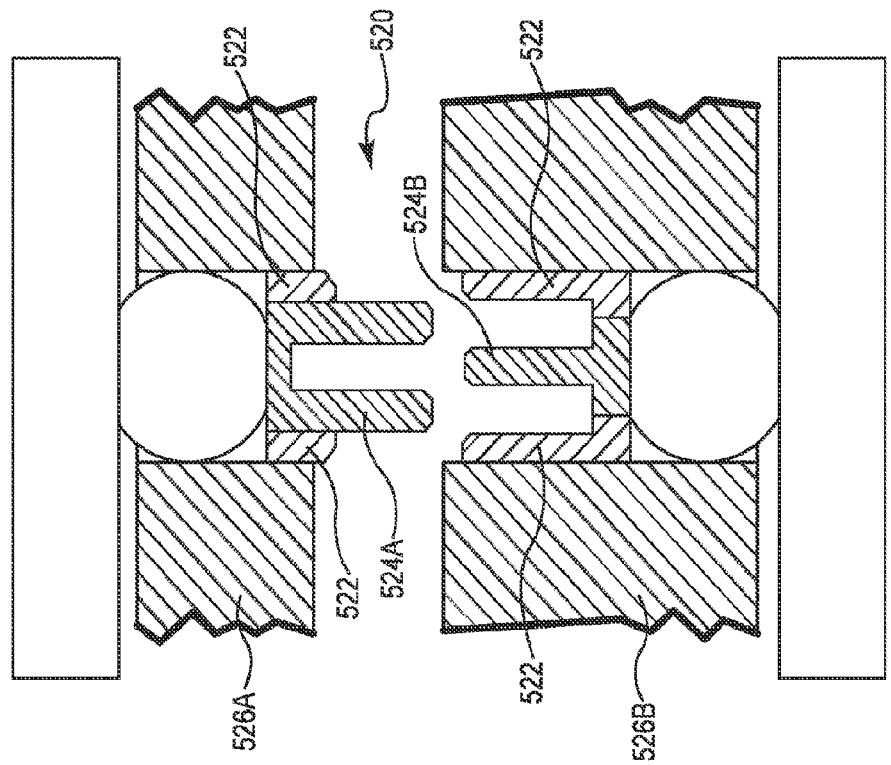
FIG. 19 is a cross-sectional view of a semiconductor device package adapter with terminals having a low friction interface with the substrates in accordance with an embodiment of the present disclosure.

FIG. 19 illustrates an alternate semiconductor device package adapter 520 with a low friction and/or dielectric material 522 at an interface between terminals 524A, 524B and the substrates 526A, 526B in accordance with an embodiment of the present disclosure. In one embodiment, the material 522 is Teflon. The material 522 facilitates insertion of the terminals 524 in the substrates 526.

Figure 20:
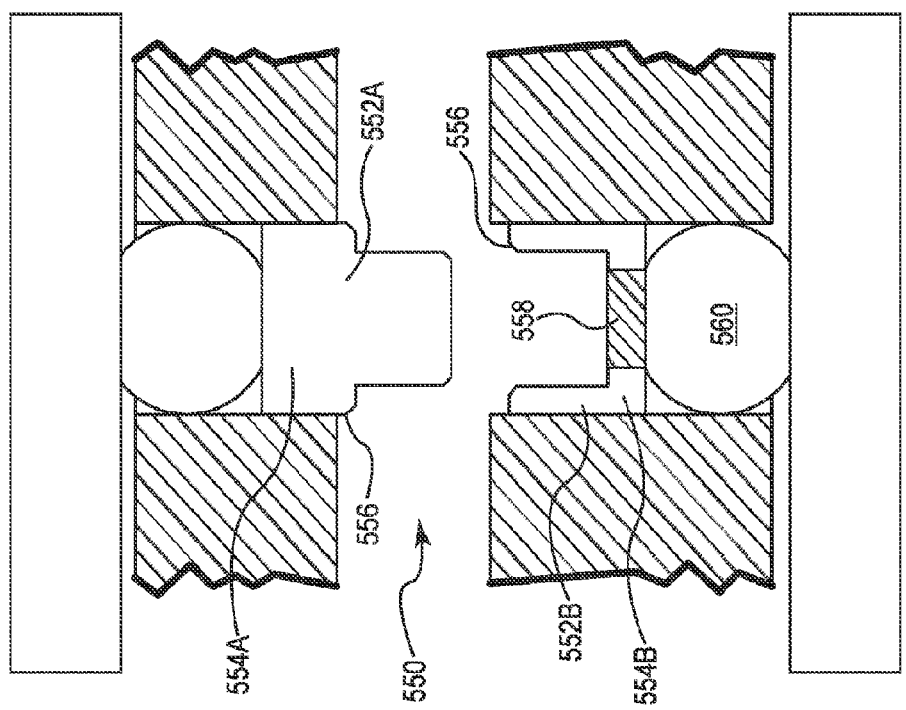
FIG. 20 is a cross-sectional view of a semiconductor device package adapter with plated terminals in accordance with an embodiment of the present disclosure.

FIG. 20 illustrates an alternate semiconductor device package adapter 550 with terminals 552A, 552B having a dielectric core 554A, 554B plated with conductive material 556 in accordance with an embodiment of the present disclosure. In the illustrated embodiment, terminal 552B includes conductive plug 558 to connect the conductive plating 556 to solder ball 560.

Figure 21:
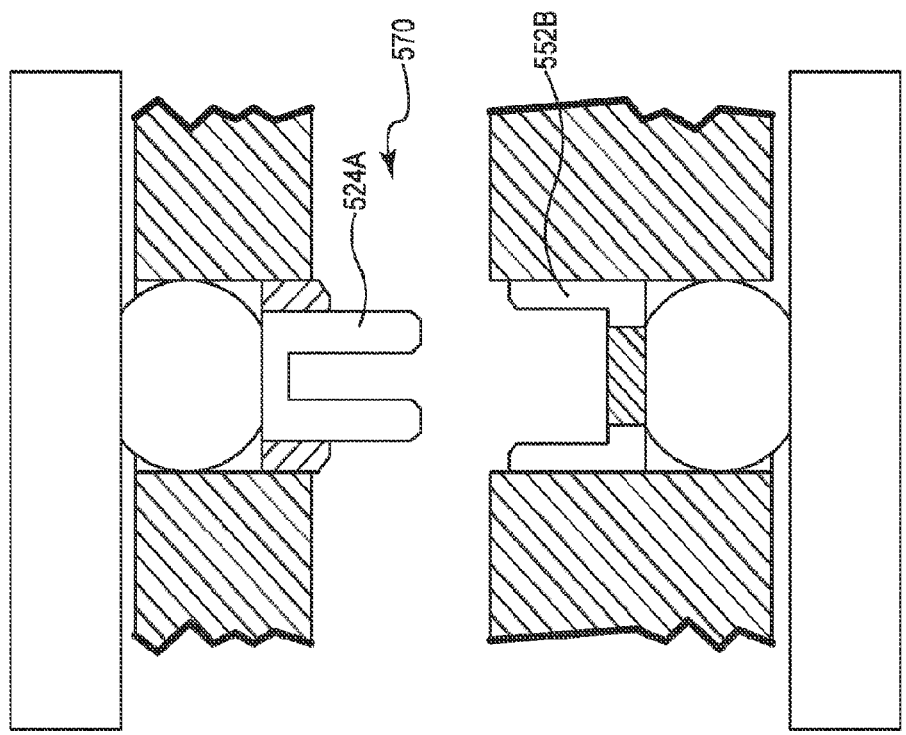
FIG. 21 is a cross-sectional view of a semiconductor device package adapter with a combination of plated and un-plated terminals in accordance with an embodiment of the present disclosure.

FIG. 21 illustrates an alternate semiconductor device package adapter 570 with terminals 524A from FIG. 19 combined with terminal 552B of FIG. 20 in accordance with an embodiment of the present disclosure. The combination of terminals 524A, 552B reduces metal content and alters capacitance for impedance tuning.

FIG. 22 illustrates an alternate semiconductor device package adapter 600 with upper contacts 602 formed with beams 604A, 604B ("604") in accordance with an embodiment of the present disclosure. First portion 606 of the adapter 600 has a base layer 608 with a through slot 610 imaged and developed that is filed with dielectric. Layer 612 includes opening 614 that is aligned with solder ball contact pad 616 on the contact 602 and sized to receive solder ball 620.

The contact 602 is inserted from the top through the openings 610 in the layer 608. The solder ball contact pad 616 rests on the base layer 608 to prevent the contact 602 passing through. The middle layer 612 secures the contact 602 in place and seals the potential for solder wicking. Top layer 618 is a solder mask that is applied and imaged to expose the solder ball attachment pad 616. The embodiment of FIG. 22 takes advantage of the drilled core principles, copper pad etched slot alignment principles, and increased compliance of the upper contact member.

The second portion 630 of the adapter 600 includes upper layer 632 drilled to form opening 634 sized to receive the beams 604 of the contact 602. The next layer 636 is drilled to form a 0.3 mm diameter hole 638 filled with dielectric 640. The dielectric 640 is imaged to form a cross shaped opening 644 to receive contact 642. The cross shaped opening 644 is aligned with corresponding cross shaped slot in the lower 9 micron thick copper pad 646. Proximal end 650 of the contact 642 is inserted into the cross shaped slots 644. Shoulders 652 on the contact 642 act as an insertion stop, while allowing the proximal end 650 to extend beyond the copper pad 646. Cross slots 644 in the dielectric 640 allows the tips 654 of the upper contact 602 to extend down into the 0.3 mm diameter hole 638. The bottom layer 656 includes drilled core 658 to receive solder ball 660 during reflow.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A semiconductor device packaged adapter to electrically couple contacts on a first circuit member to contacts on a second circuit member, the adapter comprising:
   a first substrate comprising a plurality of first terminals, proximal ends of the first terminals arranged to be soldered to the contacts on the first circuit member;
   a second substrate comprising a plurality of second terminals, proximal ends of the second terminals arranged to be soldered to the contacts on the second circuit member; and
   complementary inter-engaging structures located on distal ends of the first and second terminals that engage in a high surface area, multi-point electrical connection to electrically and mechanically couple the first circuit member to the second circuit member.

2. The adapter of claim 1 comprising recesses in the first substrate at proximal ends of the first terminals.

3. The adapter of claim 2 wherein the recesses are sized to receive solder balls on the first circuit member.

4. The adapter of claim 1 comprising recesses in the second substrate at proximal ends of the second terminals, the recesses sized to receive solder balls.

5. The adapter of claim 1 wherein the engaging structures on the second terminals extend above the second substrate.

6. The adapter of claim 1 comprising one or more layers on at least one of the first and second substrates, the layers comprising one of a ground plane, a power plane, or shielding.

7. The adapter of claim 1 comprising electrical shielding covered by a dielectric material surrounding at least the first terminals.

8. The adapter of claim 1 comprising electrical devices in one or more of the first and second substrates.

9. The adapter of claim 1 comprising at least one electrical device printed on the first or second substrate and electrically coupled to at least one terminal.

10. The adapter of claim 1 comprising routing traces on one or more of the first and second substrates, the routing traces changing a pitch between the proximal ends and distal ends of the terminals.

11. The adapter of claim 10 wherein routing traces comprise a conductive material printed in recesses in the first and second substrates.

12. The adapter of claim 1 wherein distal ends of the first terminals comprise at least one flexible beam configured to flex in response to engagement with distal ends of the second terminals.

13. The adapter of claim 1 comprising:
   guide features on the first substrate located near distal ends of the first terminals; and
   recesses on the second substrate locate near distal ends of the second terminals and configured to receive the guide features.

14. A method of electrically coupling contacts on a first circuit member to contacts on a second circuit member, the method comprising the steps of:
   soldering proximal ends of first terminals on a first substrate to the contacts on the first circuit member;
   soldering proximal ends of second terminals on a second substrate to the contacts on the first circuit member; and
   engaging complementary inter-engaging structures located at distal ends of the first and second terminals in a high surface area, multi-point electrical connection to electrically and mechanically couple the first circuit member to the second circuit member.

15. The method of claim 14 comprising locating solder balls on the first circuit member in recesses in the first substrate at proximal ends of the first terminals.

16. The method of claim 14 comprising depositing one or more of a ground plane, a power plane, or shielding on at least one of the first and second substrates.

17. The method of claim 14 comprising locating electrical shielding covered by a dielectric material around at least the first terminals.

18. The method of claim 14 comprising printing electrical devices on one or more of the first and second substrates.

19. The method of claim 14 comprising changing a pitch between the proximal ends and distal ends, of the terminals on one or more of the first and second substrates.

20. The method of claim 14 comprising printing a conductive material in recesses in the first and second substrates to form the engaging structures on the distal ends.

21. The method of claim 14 comprising flexing distal ends of the first terminals in response to engagement with distal ends of the second terminals.

22. The method of claim 14 wherein the circuit members are selected from one of a dielectric layer, a printed circuit board, a flexible circuit, a bare die device, an integrated circuit device, organic or inorganic substrates, or a rigid circuit.

* * * * *